(12) United States Patent
Huckabay

(10) Patent No.: US 7,310,797 B2
(45) Date of Patent: Dec. 18, 2007

(54) METHOD AND SYSTEM FOR PRINTING LITHOGRAPHIC IMAGES WITH MULTIPLE EXPOSURES

(75) Inventor: Judy Huckabay, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/405,029

(22) Filed: Apr. 14, 2006

(65) Prior Publication Data

US 2007/0031738 A1 Feb. 8, 2007

Related U.S. Application Data

(60) Provisional application No. 60/681,229, filed on May 13, 2005.

(51) Int. Cl.
*G06F 17/50* (2006.01)

(52) U.S. Cl. .................................. 716/21; 716/19
(58) Field of Classification Search .................. 716/21, 716/19, 2, 4, 5
See application file for complete search history.

(56) References Cited

U.S. PATENT DOCUMENTS

| 4,855,793 | A | * | 8/1989 | Carlson ........................ 355/53 |
| 5,652,084 | A | * | 7/1997 | Cleeves ....................... 430/315 |
| 6,383,697 | B1 | * | 5/2002 | Vladimirsky et al. .......... 430/30 |
| 6,553,562 | B2 | * | 4/2003 | Capodieci et al. ............. 716/19 |
| 6,839,126 | B2 | * | 1/2005 | Yen et al. ..................... 355/68 |
| 2005/0162627 | A1 | * | 7/2005 | Finders et al. ................. 355/53 |
| 2006/0216649 | A1 | * | 9/2006 | Paxton et al. ................ 430/311 |
| 2007/0003878 | A1 | * | 1/2007 | Paxton et al. ................ 430/311 |
| 2007/0031740 | A1 | * | 2/2007 | Chen et al. ...................... 430/5 |

OTHER PUBLICATIONS

Huckabay, J. et al. "Automatic Pitch Decomposition for Improved Process Window When Printing Dense Features at k1eff<0.20" Proceedings of SPIE, May 20, 2006, vol. 6283, 9 pgs.
Huckabay, J. et al. "Process Results Using Automatic Pitch Decomposition and Double Patterning Technology (DPT) at k1eff<0.20" Proceedings of SPIE, Oct. 20, 2006, vol. 6349, 11 pgs.
International Search Report and Written Opinion dated Mar. 1, 2007 for PCT/US2006/018892.
Dusa, M. et al. "An Integrated Lithography Concept with Application on 45nm 1/2 pitch flash memory devices" Optical Microlithography XIX, Proceedings of SPIE, 2006, vol. 6154, 12 pgs.
Hsu, S. et al. "Double Exposure Technique for 45nm node and Beyond" 25th Annual BACUS Symposium on Photomask Technology, Proceeding of SPIE, 2005, vol. 5992, 16 pgs.
Maenhoudt, M. et al. "Double Patterning scheme for sub-0.25 k1 single damascene structures at NA=0.75, λ=193nm" Optical Microlithography XVIII, Proceedings of SPIE, 2005, vol. 5754, pp. 1508-1518.
Park, J. et al. "Application Challenges with Double Patterning Technology (DPT) beyond 45nm" Photomask Technology 2006, Proceeding of SPIE, 2006, 12 pgs.

* cited by examiner

*Primary Examiner*—Sun James Lin
(74) *Attorney, Agent, or Firm*—Bingham McCutchen LLP

(57) ABSTRACT

System and method is disclosed for breaking an integrated circuit design to be printed into two or more exposures by lithographic equipment, each of the two or more exposures has at least the minimum pitch. Together, these multiple exposures print an integrated circuit design that could not be printed in one exposure alone.

45 Claims, 24 Drawing Sheets

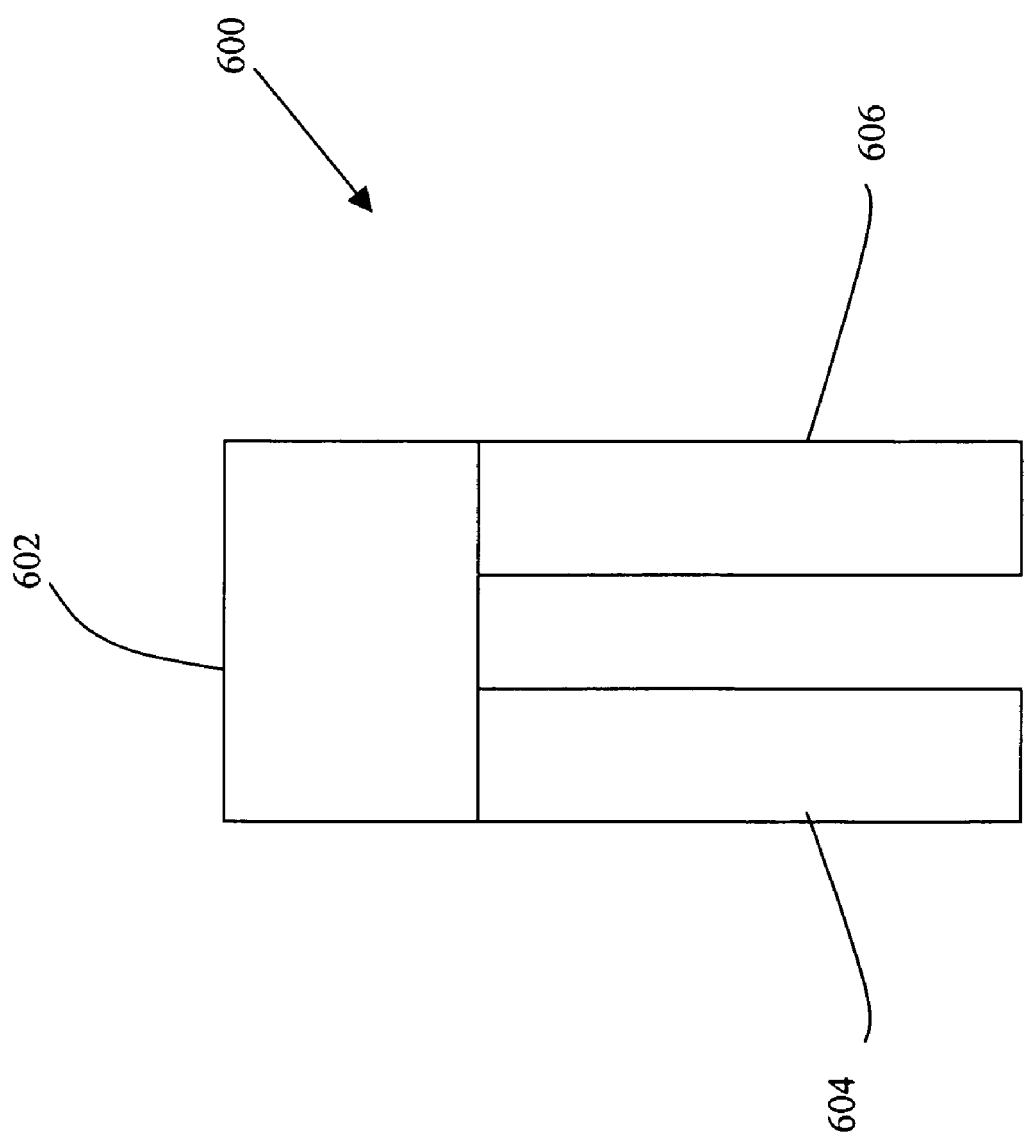

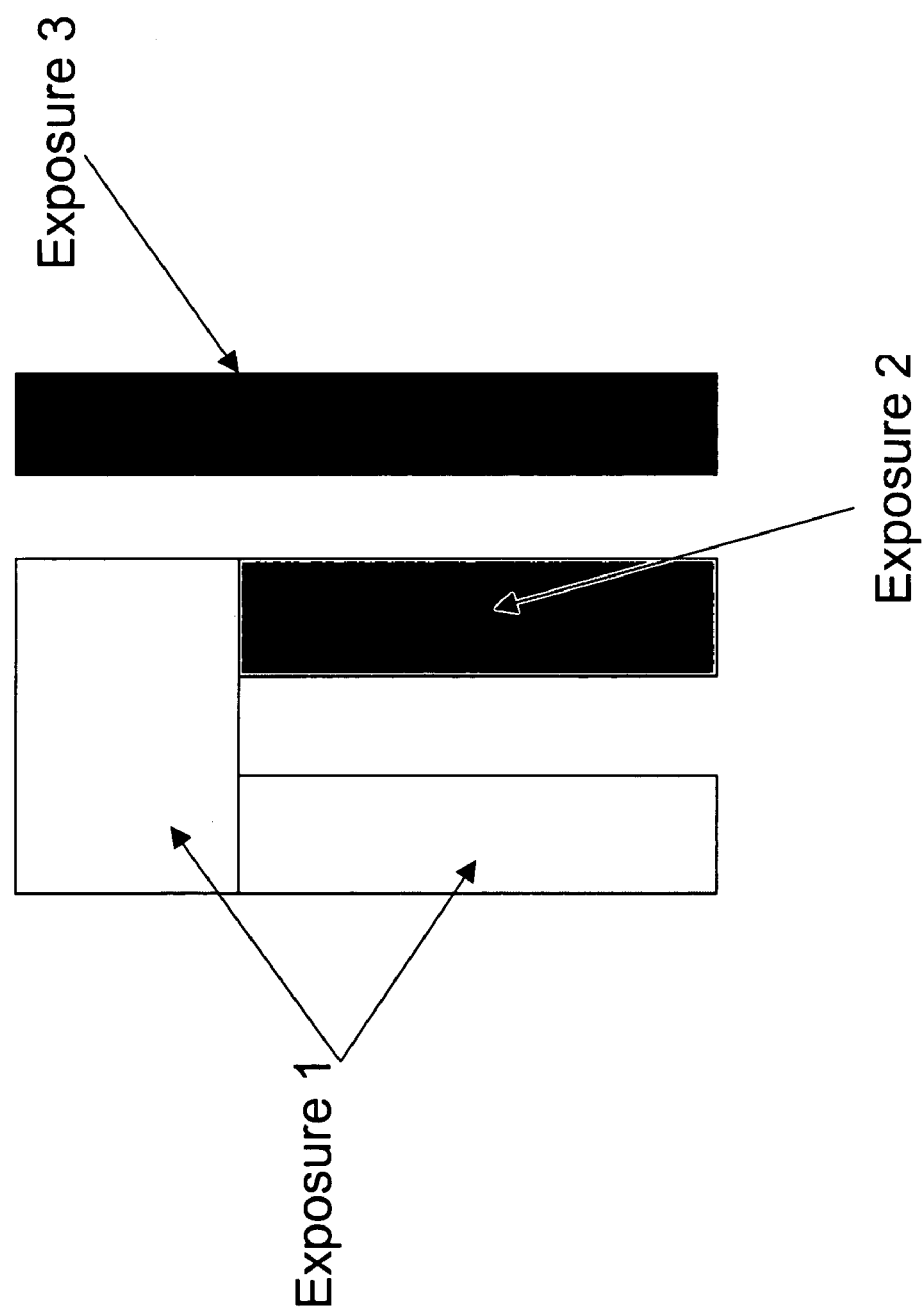

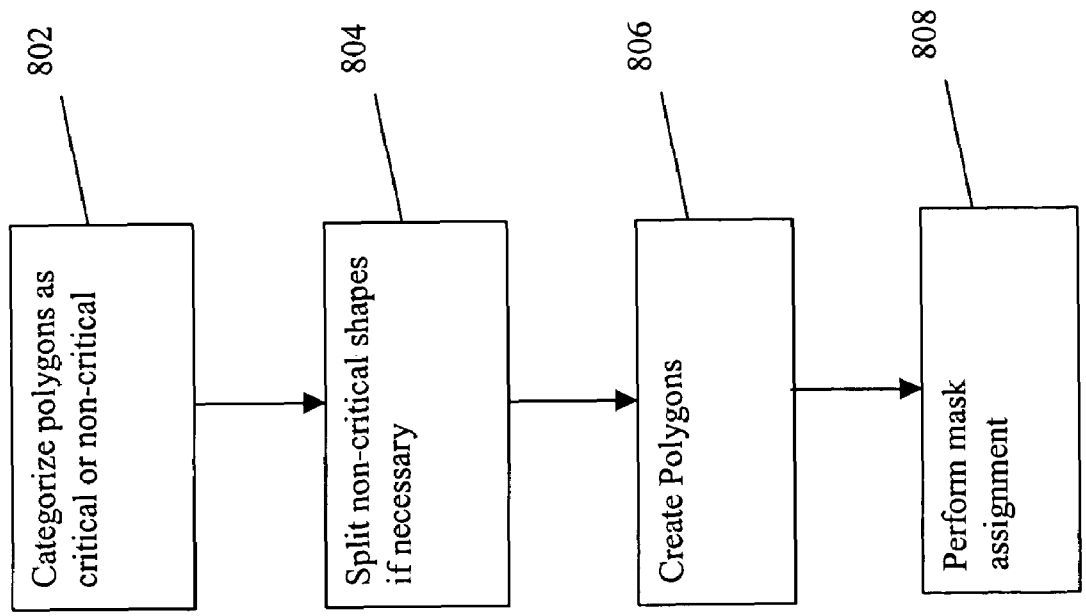

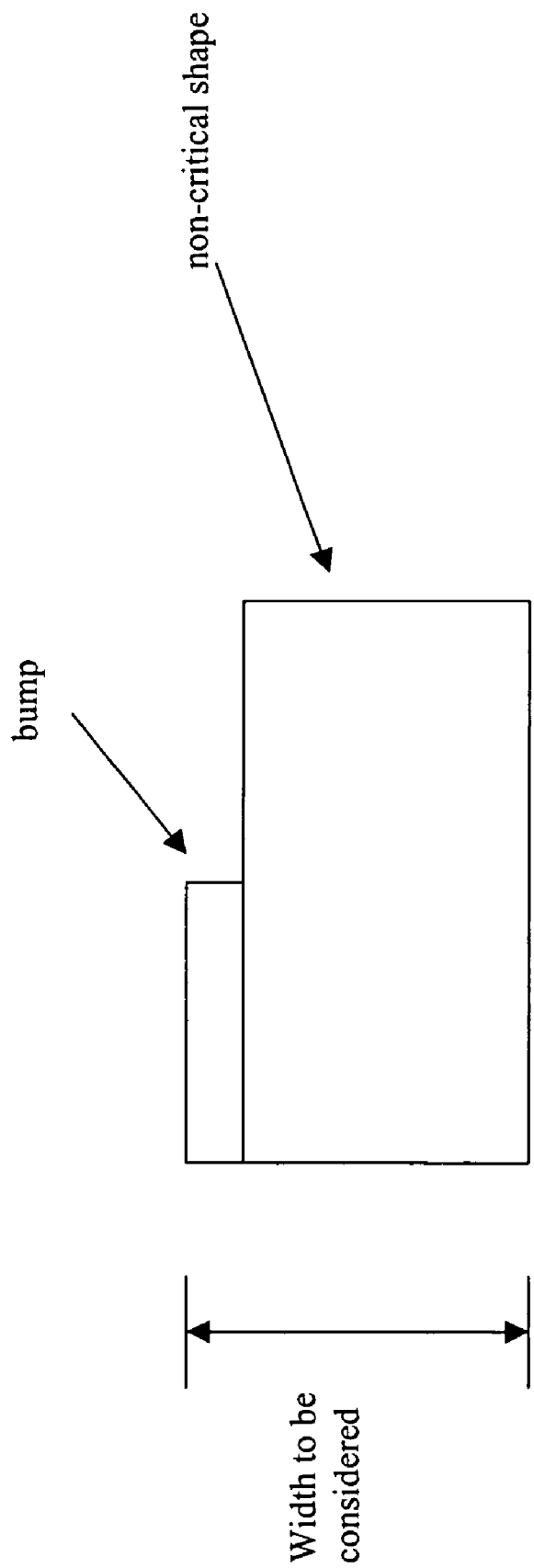

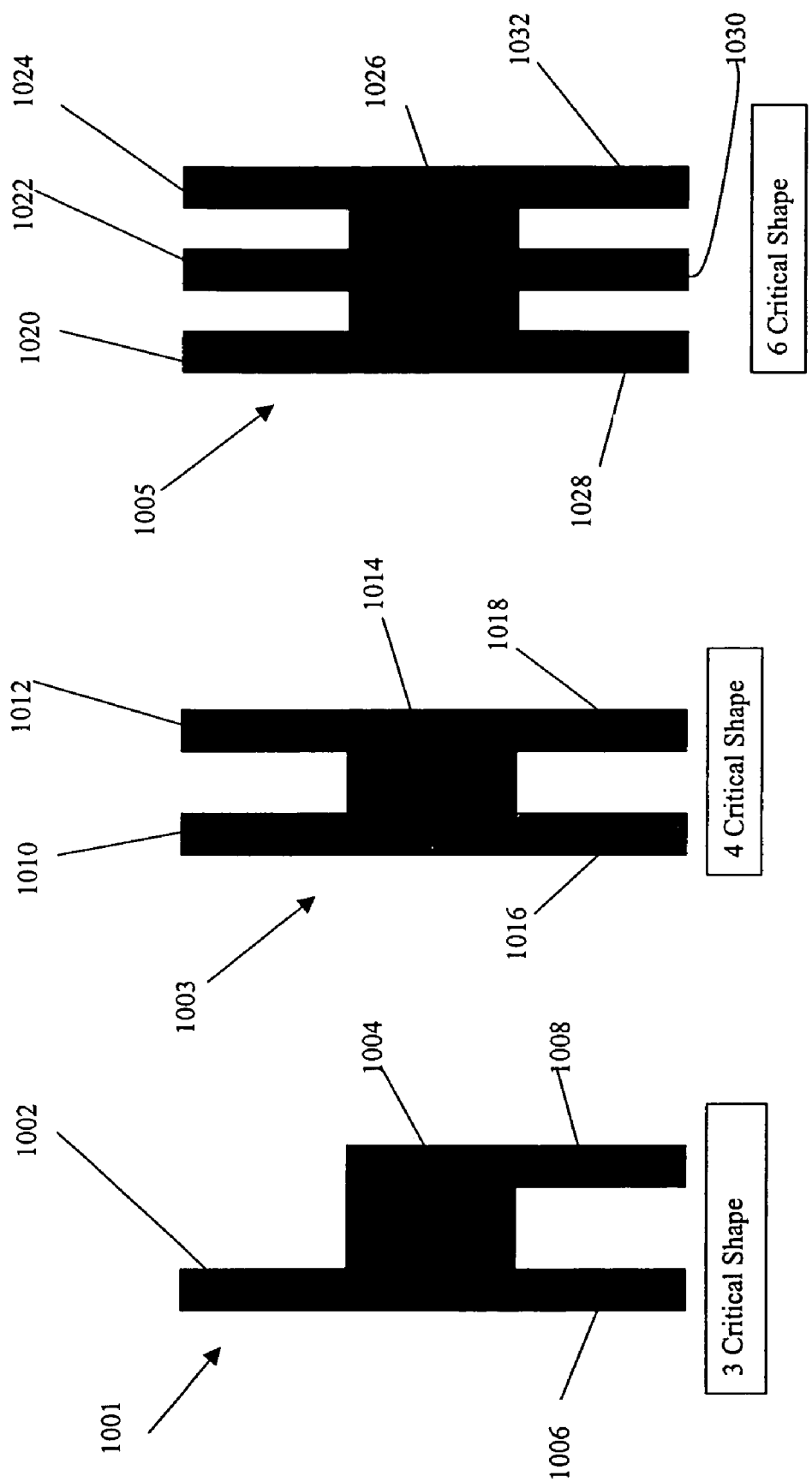

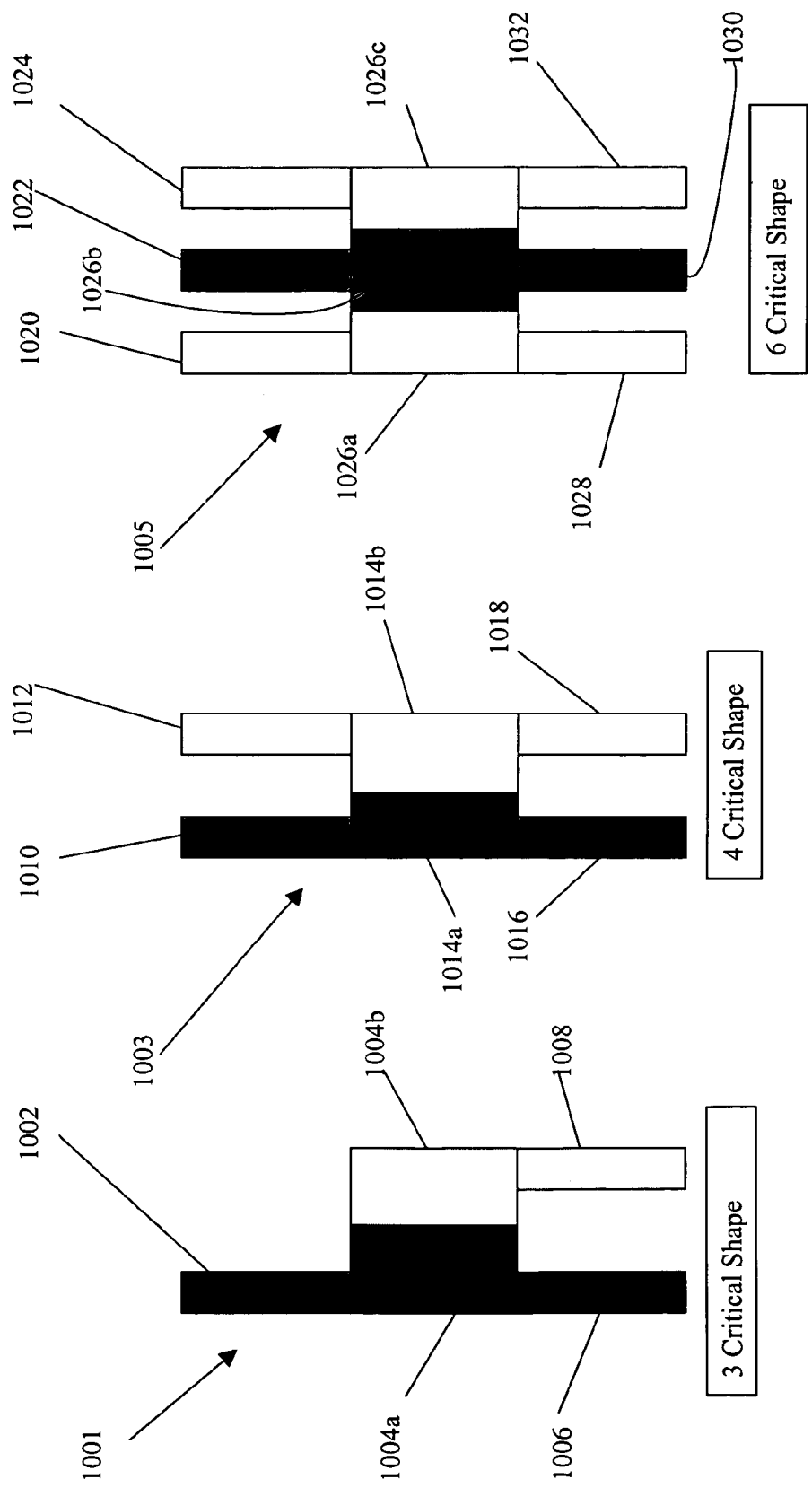

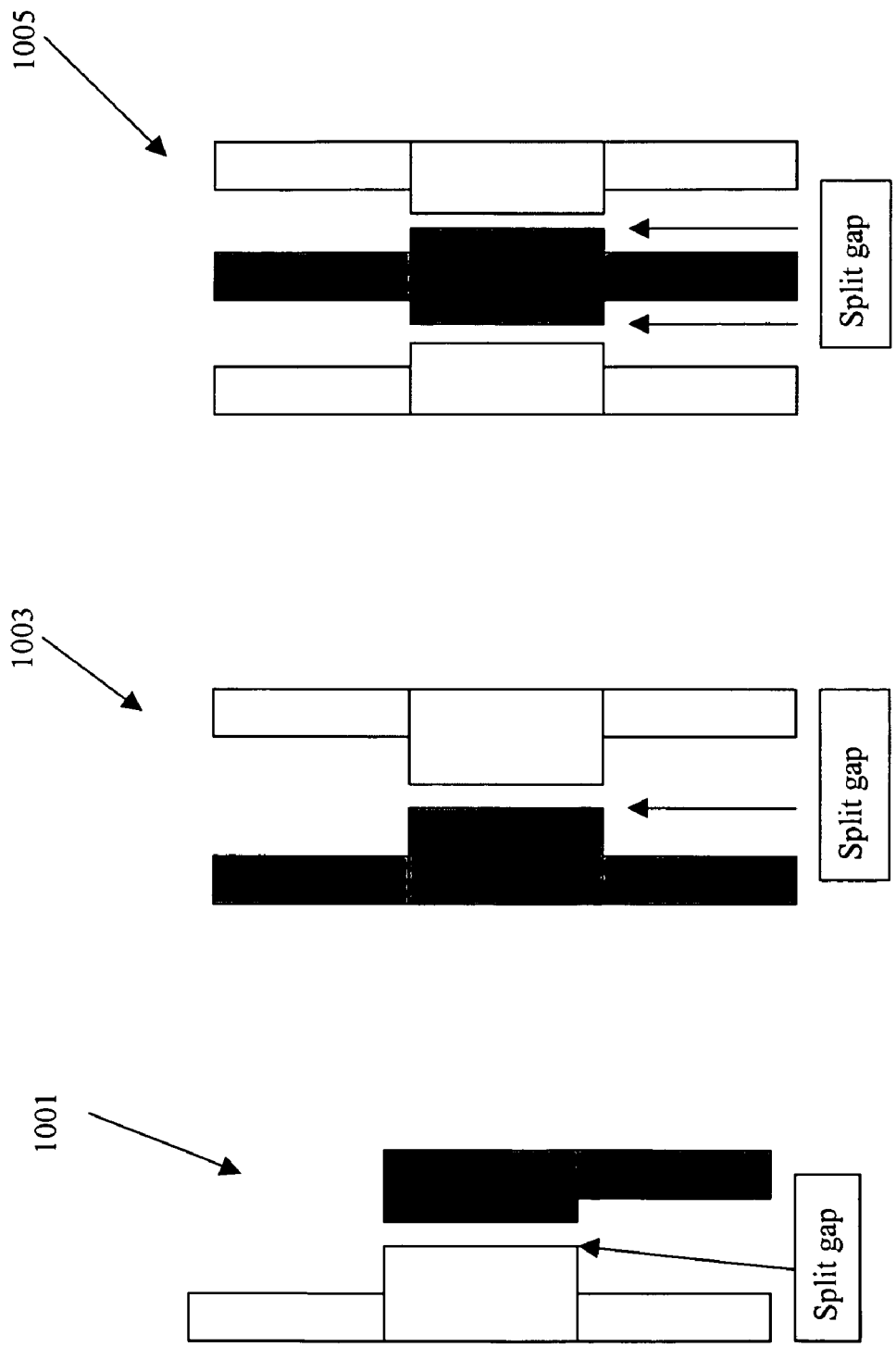

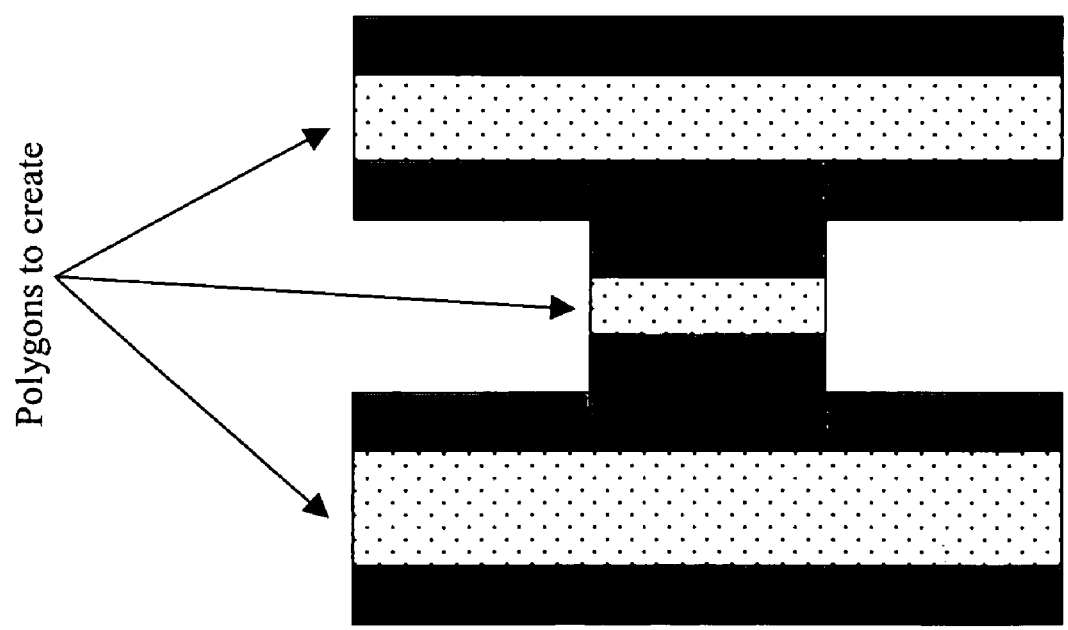

Fig. 14

Fig. 15
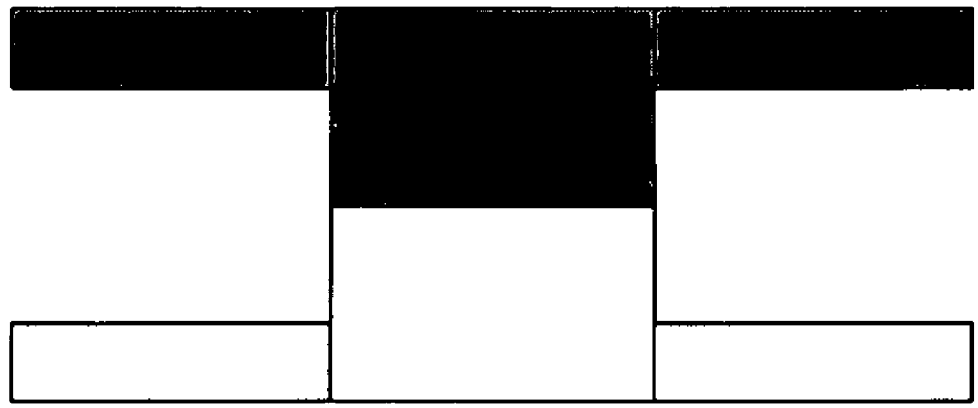

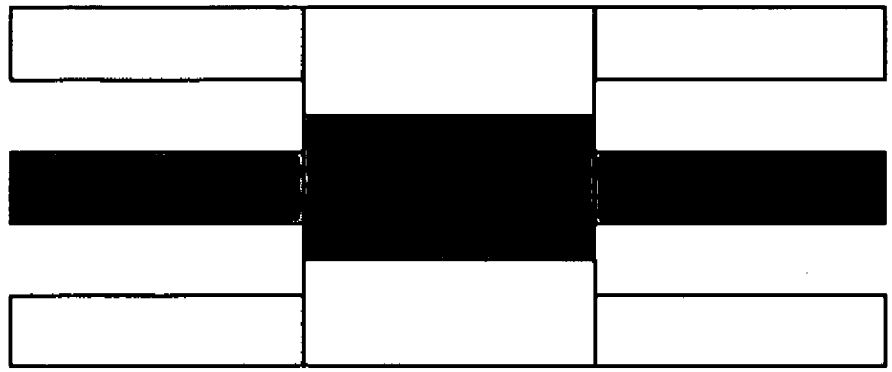
Fig. 18
Constraint Removed
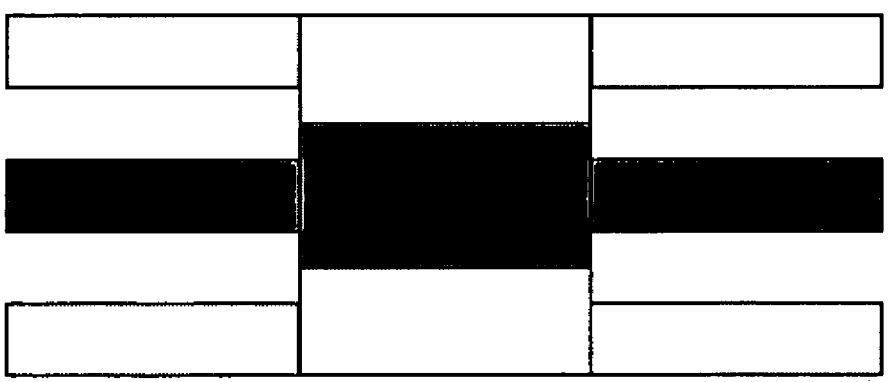
Constrained

METHOD AND SYSTEM FOR PRINTING LITHOGRAPHIC IMAGES WITH MULTIPLE EXPOSURES

RELATED APPLICATION

The present application claims the benefit of U.S. Provisional Application No. 60/681,229, filed May 13, 2005, the entire disclosure of which is hereby incorporated by reference herein.

BACKGROUND

The invention relates to the design and manufacture of integrated circuits, and more particularly, to systems and methods for improving the photolithographic process of manufacturing an integrated circuit.

The electronic design process for an integrated circuit (IC) involves describing the behavioral, architectural, functional, and structural attributes of an IC or electronic system. Design teams often begin with very abstract behavioral models of the intended product and end with a physical description of the numerous structures, devices, and interconnections on an IC chip. Semiconductor foundries use the physical description to create the masks and test programs needed to manufacture the ICs. EDA tools are extensively used by designers throughout the process of designing, verifying, and manufacturing electronic designs.

Photolithography is an optical printing and fabrication process by which features on a photomask are imaged and defined onto a photosensitive layer coating a substrate. The photomask may be used to generate the same master pattern on many locations on a given substrate as well as on many substrates. Photolithography and photomasks are critical to the efficient manufacture of integrated circuits (ICs) and to the progression of the IC industry.

For IC fabrication applications, photomask features correspond to the various base physical IC elements which comprise functional circuit components such as transistors, and interconnect wires, contacts, and vias as well as other elements which are not functional circuit elements but are used to facilitate, enhance, or track various manufacturing processes.

Through sequential use of the various photomasks corresponding to a given IC in an IC fabrication process a large number of material layers of various shapes and thicknesses and with various conductive and insulating properties may be built up to form the overall integrated circuit. The photolithography process generally follows IC design and photomask fabrication.

As represented in FIG. 1, each combination of light/optics has a certain maximum spatial frequency on the wafer. In conventional IC manufacturing processes, the smallest size of any features that can be created on a wafer is severely limited by the pitch of the processing system. A pitch is a combination of the width of a feature plus the spacing between features. As shown in FIG. 2, a photolithographic process can make a narrow line by adjusting the threshold or dose, but not a smaller pitch.

As the complexity of modern IC designs increase over time, the quantity and density of shapes on an IC design also increase in corresponding fashion. However, the goal of manufacturing IC chips at ever denser and smaller feature sizes is in sharp tension with the pitch limits of existing photolithographic processing tools which are significantly limited by pitch size.

Therefore, it is clearly desirable for integrated circuit designers and manufacturers to have access to improved systems and methods for implementing photolithographic processes which allow of manufacture of features on an integrated circuit with smaller features sizes.

SUMMARY

In some embodiments, the system and method of the invention break the design to be printed into two or more exposures, each of which has at least the minimum pitch. Together, these multiple exposures print a design that could not be printed in one exposure alone. This approach allows smaller mask features to be printed on wafers without requiring new manufacturing equipment and with minor changes to existing manufacturing processes. The approach also does not require restrictions on the design of the chip.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

FIGS. 6A-D show different multi-exposure configurations.

FIGS. 7A-B show configurations having different numbers of exposures.

FIG. 8 shows a detailed flowchart of a process for manufacturing an integrated circuit according to some embodiments of the invention.

FIG. 9 shows processing of a bump in a layout.

FIGS. 10A-C, 11A-C, and 12A-C illustrate processing or configurations having different numbers of critical shapes.

FIG. 13 illustrates polygons that are created.

FIGS. 14 and 15 illustrate processing of gaps.

FIG. 18 illustrates layouts that are over-constrained.

DETAILED DESCRIPTION

In some embodiments, the system and method of the invention break the design to be printed into two or more exposures, each of which has at least the minimum pitch.

Together, these multiple exposures print a design that could not be printed in one exposure alone. This approach is an allows smaller mask features to be printed on wafers without requiring new manufacturing equipment and with minor changes to existing manufacturing processes. The approach also does not require restrictions on the design of the chip.

Figure 1:
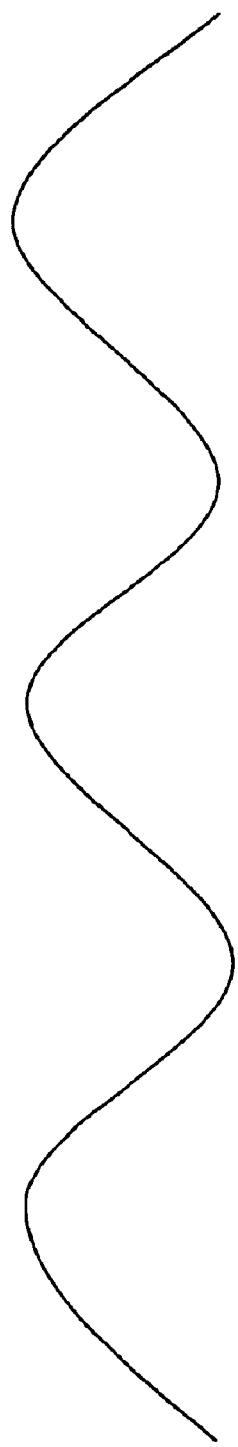
FIGS. 1-2 illustrate optical effects for lithographic processing operations.
Figure 2:
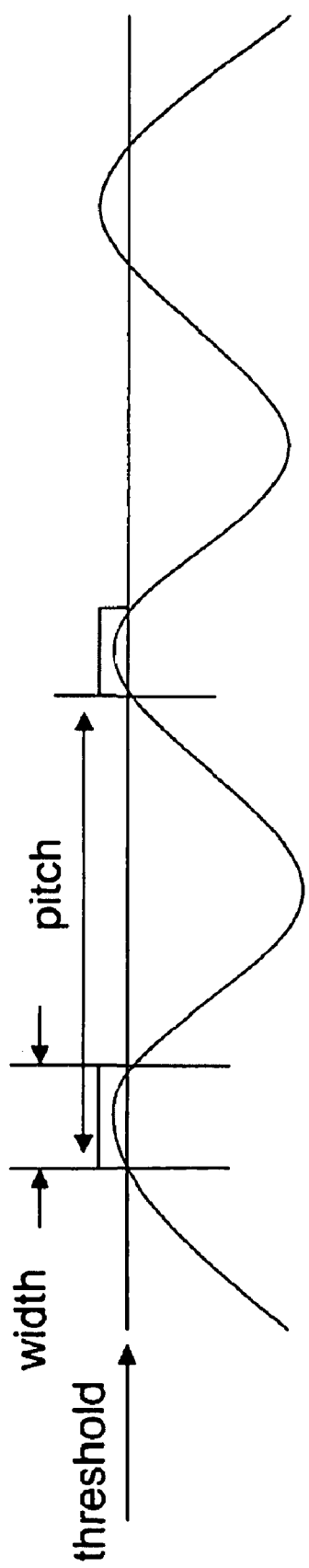
Figure 3:
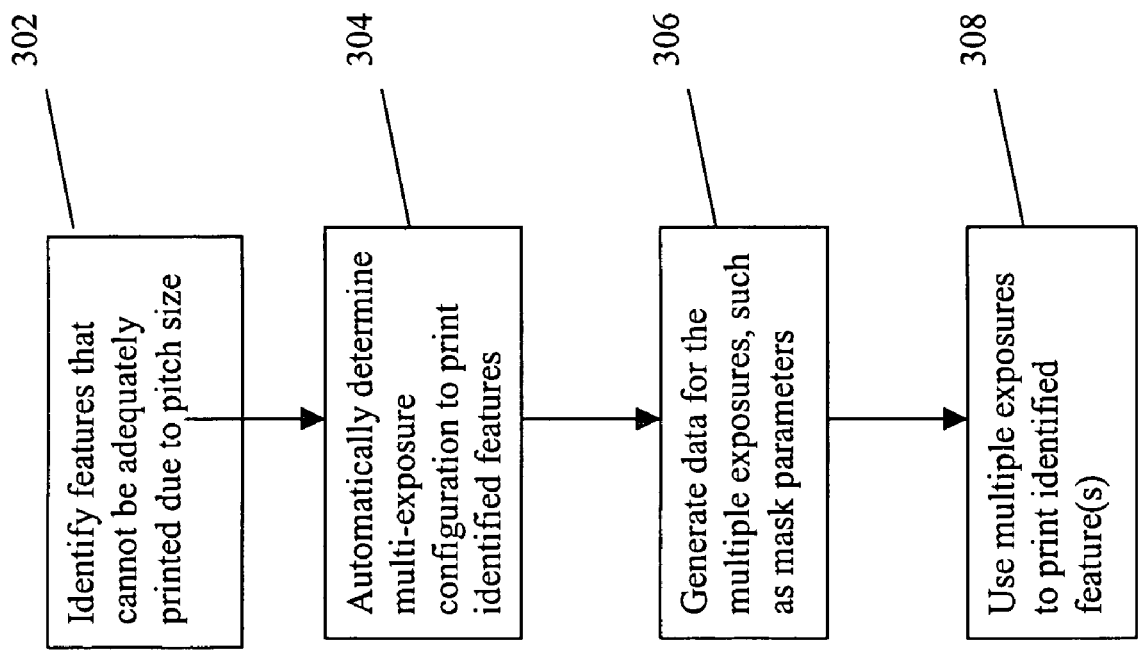
FIG. 3 shows a flowchart of a process for manufacturing an integrated circuit according to some embodiments of the invention.

FIG. 3 illustrates a high-level flowchart of a process to implement multiple-exposure printing according to some embodiments of the invention. At 302, identification is made of features that cannot be adequately printed, e.g., due to pitch size restrictions of the processing equipment.

At 304, the process determines the multi-exposure configuration to print the identified features from 302. This action identifies which of the identified features should be separated from other features to avoid pitch problems during the exposure portion of the fabrication process. In some embodiments, the process performs the actions of 304 in an automated manner, such as the approach described in more detail below with respect to FIG. 5. In other embodiments, the actions of 304 may be performed either manually (e.g., using a layout editor tool) or with a combination of automated actions and manual actions.

Data to be used during the manufacturing process is generated at 306. This action includes, for example, generating mask parameters for the two or more photomasks that will be used during the multiple exposures of the design.

During the manufacturing process, multiple exposures can then be used to print the identified features (308). Conventional alignment techniques are employed to ensure the proper alignment between the multiple exposures.

Figure 4:
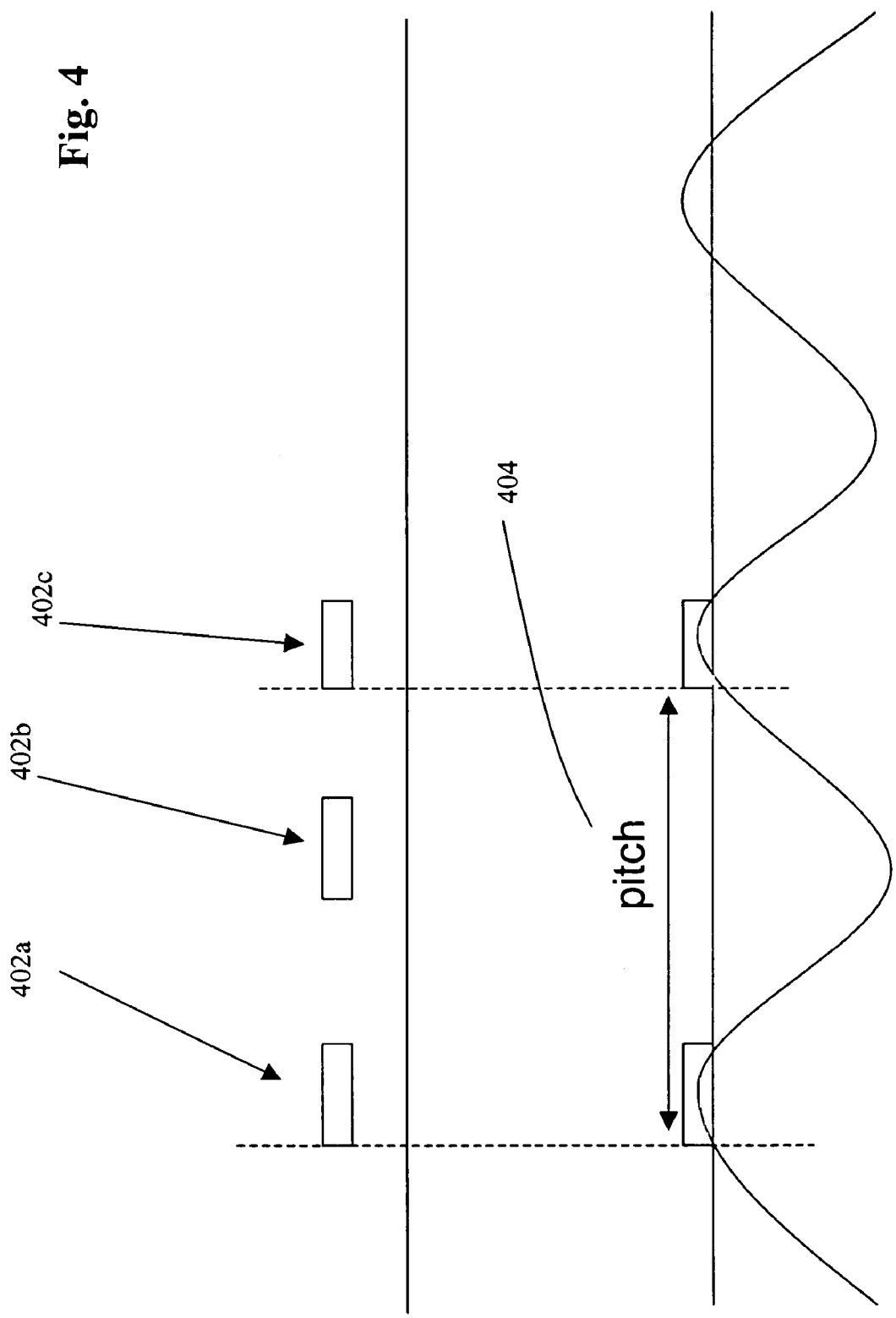
FIG. 4 illustrates an example set of features to print on lithographic processing equipment.

Consider if it is desired to print the example set of features 402a-c shown in FIG. 4. Assume that the minimum pitch for the processing equipment being used to manufacture an IC product having this configuration of features 402a-c is the pitch 404 as shown between the dotted lines at the bottom of FIG. 4. It can be seen that the width/distances between the features 402a-c are smaller than the minimum pitch 404, rendering the configuration of features 402a-c unprintable by conventional techniques. In particular, feature 402b cannot be conventionally printed when it is positioned so close to features 402a and 402c.

Figure 5:
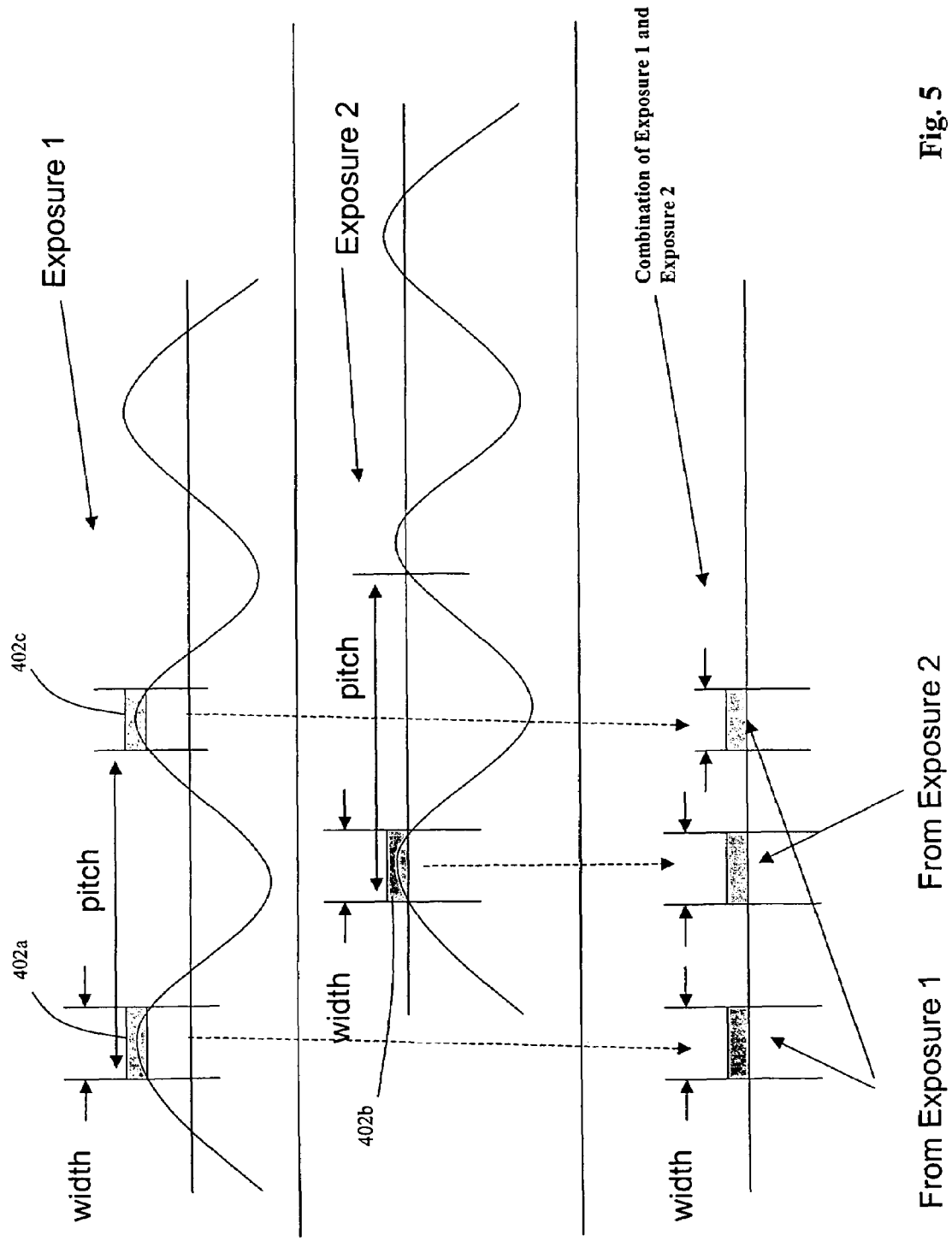
FIG. 5 illustrates using multiple exposures to manufacture an integrated circuit according to some embodiments of the invention.

FIG. 5 illustrates an approach for printing the configuration of features 402a-c according to some embodiments of the invention. The initial action is to determine which of the features should be separated into different exposures. As previously noted, feature 402b is too close in distance to features 402a and 402c to be conventionally printed. Therefore, in this example, feature 402a and 402c are manufactured using a first distinct exposure. Feature 402b is manufactured using a second distinct exposure. The combination of the first and second exposures would result in manufacture of the features 402a-c as shown in the bottom of FIG. 5.

Different exposure configurations may be employed within the scope of the invention, even for the same set of shapes. For example, consider the set of features 600 shown in FIG. 6A. Features 600 includes a first shape 602, a second shape 604, and a third shape 606. Assume that the distance between shape 604 and shape 606 is too small to be printed using conventional lithography equipment. Further assume that shape 602 is sufficiently wide such that it can be reasonably printed using conventional processing equipment. In this circumstance, the multi-exposure approach of the present invention can be employed to print features 600 on conventional processing equipment.

Figure 6B:
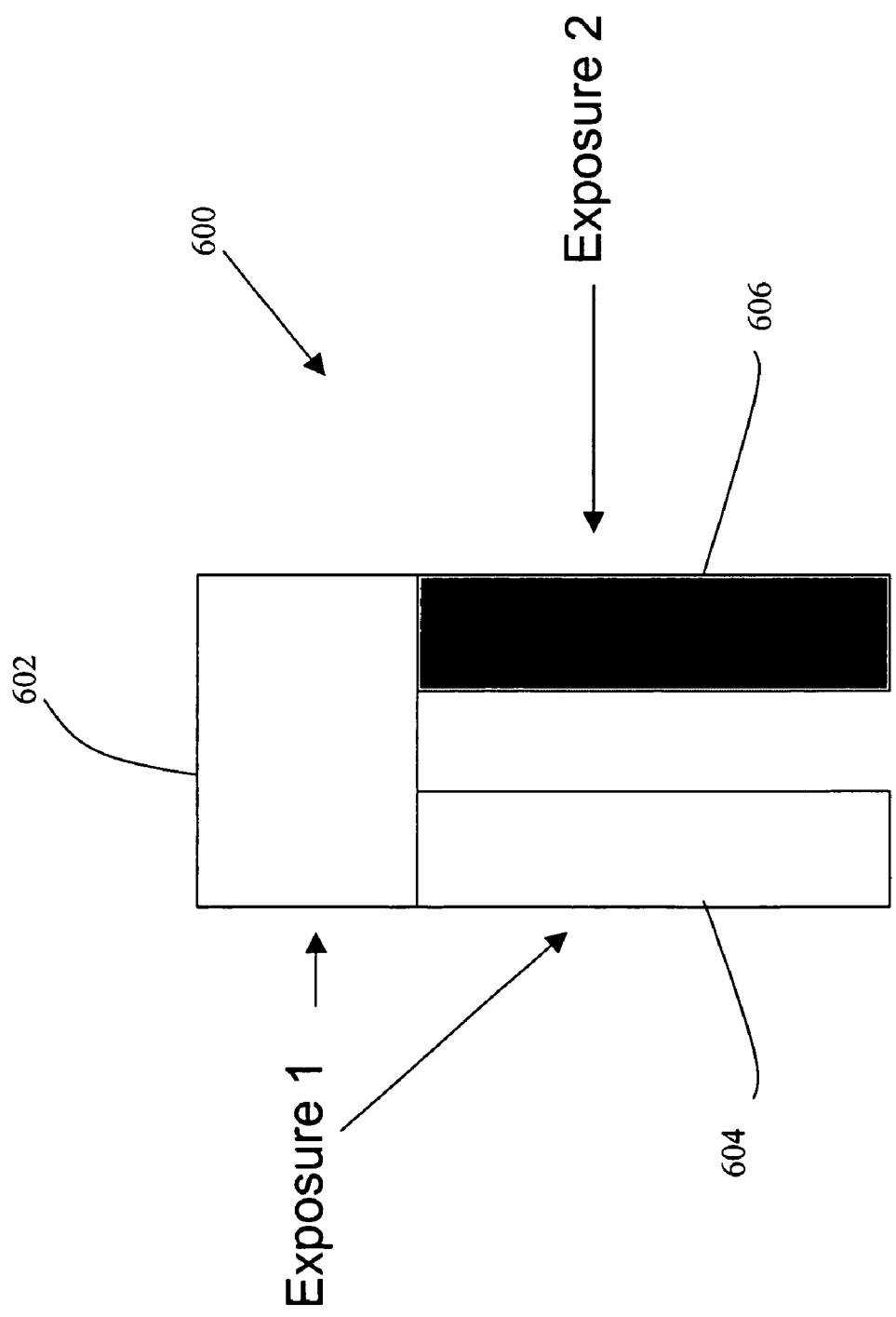

FIG. 6B shows a first example approach for configuring multiple exposures for the set of features 600. In this configuration, shapes 602 and 604 are printed using a first exposure and shape 606 is printed using a second exposure.

Figure 6C:
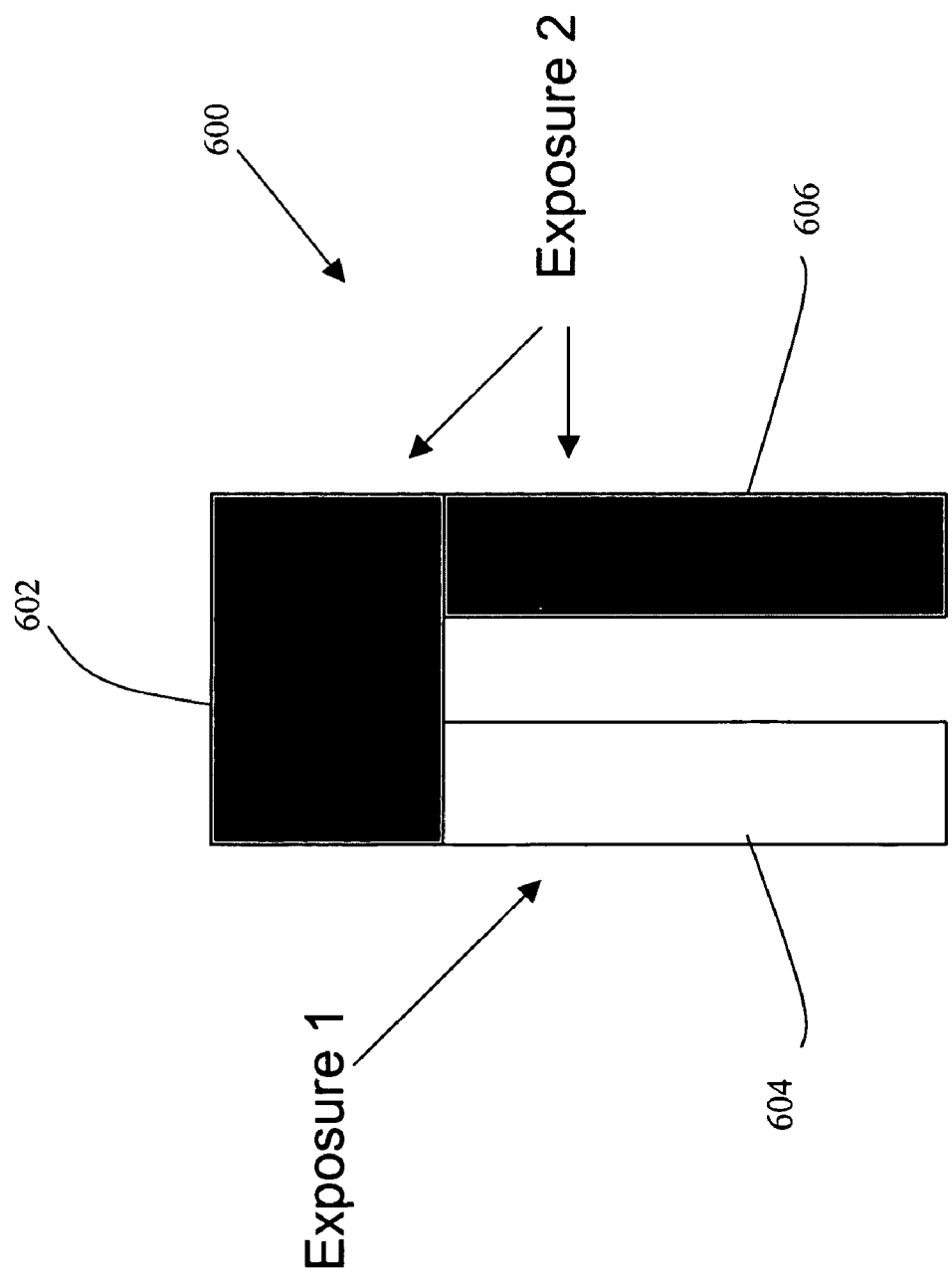

FIG. 6C shows a second example approach for configuring multiple exposures for the set of features 600. In this configuration, shape 604 is printed using a first exposure and shapes 602 and 606 are printed using a second exposure.

Figure 6D:
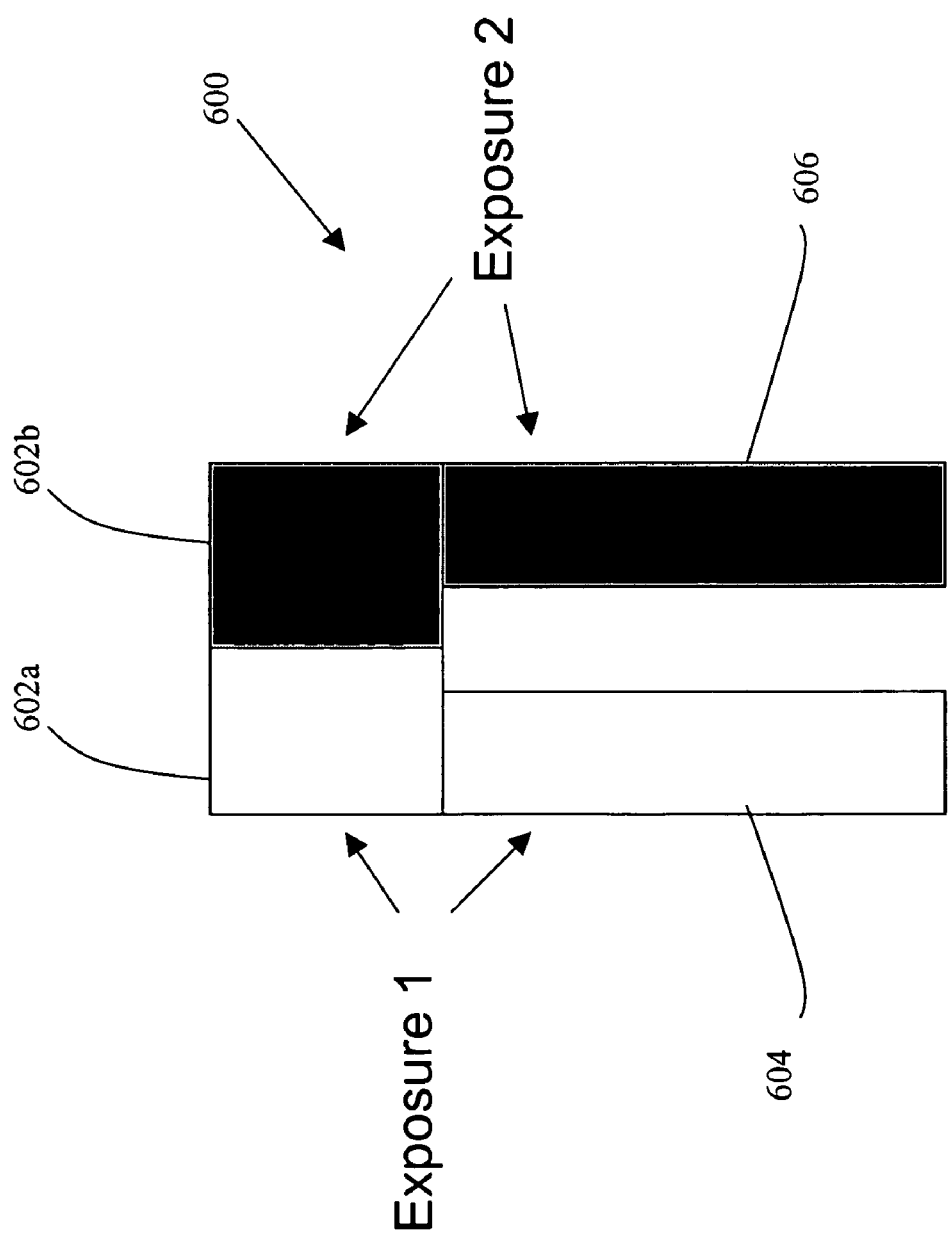

FIG. 6D shows a third example approach for configuring multiple exposures for the set of features 600. In this configuration, shape 602 is split into two shapes 602a and 602b. Shape 602a and 604 are printed using a first exposure and shapes 602b and 606 are printed using a second exposure.

While some of the disclosed illustrative embodiments only show two exposures being used, it is noted that more than two exposures may be employed within the scope of some embodiments of the invention. The number of exposures is guided by the specific application to which the invention is directed. Therefore, the scope of the invention is not to be limited to any specific number of exposures and indeed may encompass any number of exposures.

Figure 7B:
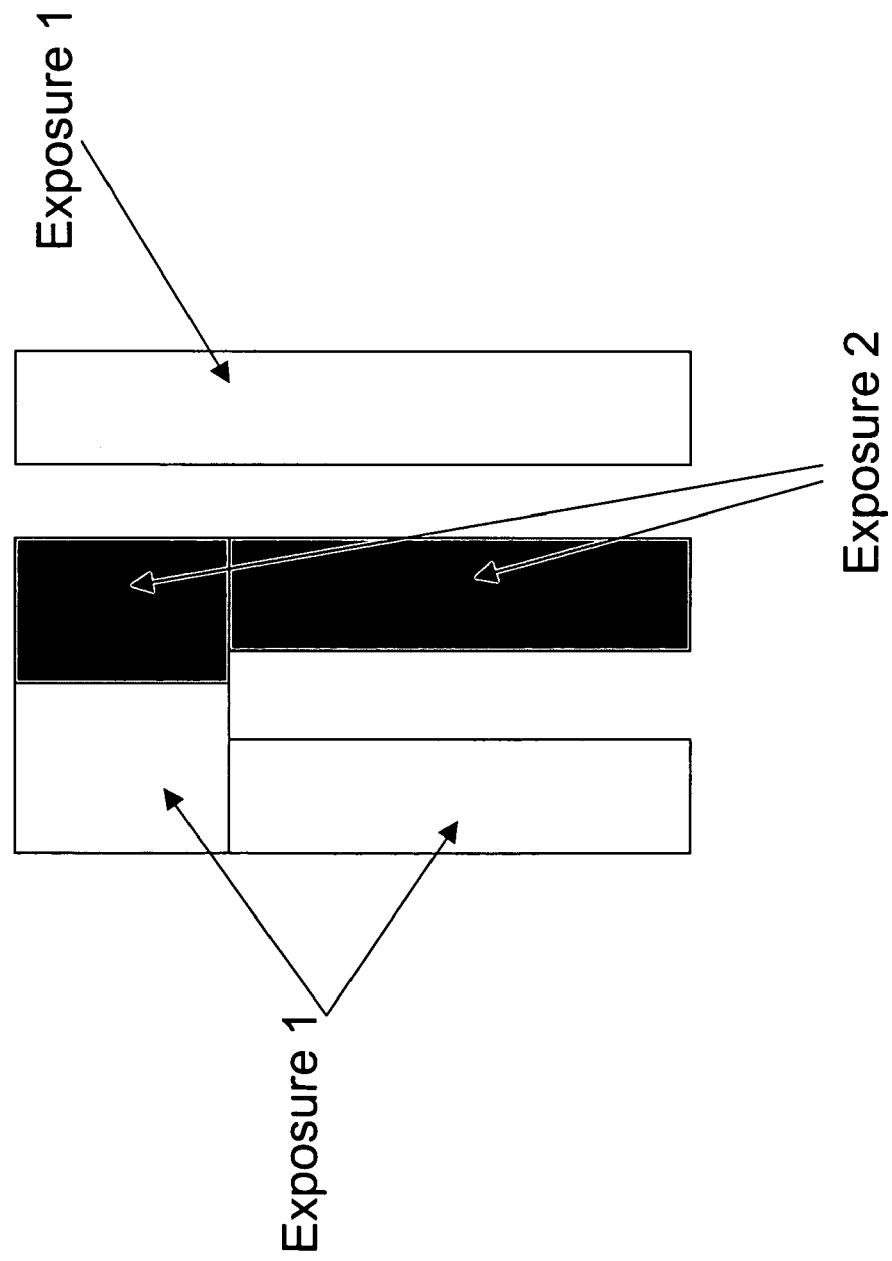

Referring to FIG. 7A, the set of shapes can be printed using three exposures, with the shapes on the left side printed using a first exposure, the middle shape printed using a second exposure, and the shape on the right side printed using a third exposure. It is noted that this set of features could also be printed using only two exposures as shown in FIG. 7B, by splitting the top shape and printing a set of shapes using a first exposure and a second set of shapes using a second exposure. In one embodiment, at most four exposures are used to print a design, based upon the 4 color theorem in which any planar map can be colored with at most four colors in such a way that adjacent areas have different colors.

The number of exposures could affect the efficiency of the processing system. If it is significantly more expensive to introduce additional exposures, then it may be more efficient to use configurations having fewer exposures than more exposures. Thus, the approach of FIG. 7B may be more efficient in certain environments than the approach of FIG. 7A.

Some embodiments of the invention are employed in conjunction with a non-linear resist response within the processing system. This avoids the problem in which the sum of two sine waves is another sine wave with a phase shift, causing one wider line rather than two small lines.

FIG. 8 shows a detailed flowchart of a process for implementing some embodiments of the invention. The following parameter values are used to implement the process according to some embodiment

MIN_CRIT_WIDTH
MAX_CRIT_WIDTH
MIN_CRIT_SPACE
MAX_CRIT_SPACE
SPLIT_OVERLAP

The MIN_CRIT_WIDTH parameter refers to the minimum width that is printable using a given set of lithographic processing equipment. A shape that has a width which is smaller than the MIN_CRIT_WIDTH is too small to be printed. The MAX_CRIT_WIDTH parameter refers to the width at which a shape is conventionally printable using a set of lithographic processing equipment. Shapes that have a width larger than MAX_CRIT_WIDTH do not need to be interleaved to be printed.

The process identifies polygons with a width between MIN_CRIT_WIDTH and MAX_CRIT_WIDTH, inclusive, and interleave them using two (or more) different exposures.

These shapes are referred to as critical shapes and are the shapes that cannot be normally printed using conventional lithography equipment.

Shapes wider than this range of shapes can be placed on one of the split layers based on their adjacency to critical shapes. These shapes are referred to as non-critical shapes and can be normally printed using existing lithography equipment.

Different combinations of spacing may exist in a design. The combined value of the MIN_CRIT_WIDTH parameter and the MIN_CRIT_SPACE parameter is the minimum pitch. The combined value of the MAX_CRIT_WIDTH parameter and the MAX_CRIT_SPACE parameter is the maximum pitch. In some embodiments, the process looks for spacing between critical shapes and all shapes <=CRIT_SPACE. These shapes are referred to as adjacent to critical shapes.

At action 802 of FIG. 8, polygons on the layout are divided into critical portions and non-critical portions based on the above criteria. The shapes identified as being "critical" are those that potentially need to be interleaved with multiple exposures to be printed. The shapes identified as being "non-critical" are those that likely do not need multiple exposures to be printed. The critical shapes can be determined by identifying all shapes with a width smaller than MAX_CRIT_WIDTH but larger than the MIN_CRIT_WIDTH. The non-critical shapes can be determined by identifying all shapes with a width larger than the MAX_CRIT_WIDTH.

In some embodiments, an action is taken to identify shapes with a width smaller than MAX_CRIT_WIDTH, but is abutting a non-critical shape. A determination can be made whether the additional shape, referred to as a "bump" is sufficiently small. If so, then the bump is considered a jog in the line, and can be considered as part of the non-critical shape as illustrated in FIG. 9.

In one embodiment, the identified critical shapes can be placed on a first set of one or more temporary layers and the non-critical shapes placed on another temporary layer of the design.

At 804, the process splits non-critical shapes. This action is optional since shapes to be split can be retained as a single shape and associated in their entirety with a single exposure. However, one reason for splitting shapes is to reduce the number of exposures for the process, as illustrated by the difference between the three-exposure approach of FIG. 7A (which does not split shapes) and the two-exposure approach of FIG. 7B (which does split shapes).

Action 804 can be implemented by identifying non-critical shapes that abut or are sufficiently adjacent to more than one critical shape. The process can then look for ideal split locations. This provides some freedom in deciding which split layer to place the critical shapes on without violating the requirements for width, spacing and adjacency.

The process then places the split locations in the non-critical portions of the shapes. This action can be made with deference to lithography considerations.

The action is performed by detecting the non-critical shapes that have more than one critical shape that abuts or is sufficiently adjacent to it. Then, a determination is made of the number of critical shapes abutting/adjacent to it, and a classification is made of these shapes based on this number, as well as the width of the non-critical shape.

To illustrate, consider the set of shapes 1001, 1003, and 1005 shown in FIGS. 10A, 10B, and 10C, respectively. Set 1001 shown in FIG. 10A includes a non-critical shape 1004 that abuts three critical shapes 1002, 1006, and 1008. Set 1003 shown in FIG. 110B includes a non-critical shape 1014 that is abutted by four critical shapes 1010, 1012, 1016, and 1018. Set 1005 shown in FIG. 10C includes a non-critical shape 1026 that abuts six critical shapes 1020, 1022, 1024, 1028, 1030, and 1032.

For each classification, a separate cut-line or set of cut-lines are used to split the shapes. Measurement of the non-critical portion and the type of classification is used to determine the number and configuration of shapes that will result from the splitting action.

For example, for the classification having six critical shapes that abut the non-critical shape 1026 in FIG. 10C, a determination is made of the bounding box of the critical shape <3*MIN_CRIT_WIDTH+(2*MIN_CRIT_SPACE). This is done by cutting the non-critical shape 1026 in the axis parallel to the edge of it's bounding box that is not adjacent to the critical shapes, MAX_CRIT_WIDTH away. This allows the division of this shape 1026 into 3 pieces, two that are MAX_CRIT_WIDTH wide on the outside, and a center piece that is "leftover". The result of this splitting action is shown in FIG. 11C, in which shape 1026 has been split into shapes 1026a, 1026b, and 1026c.

In a similar manner, the non-critical shape 1004 of FIG. 10A is split into shapes 1004a and 1004b as shown in FIG. 11A. Likewise, the non-critical shape 1014 of FIG. 10B can be split into shapes 1014a and 1014b as shown in FIG. 11B.

A gap is created between each of the shapes that is smaller than MIN_CRIT_SPACE. A layer is created (which is referred to as "Split") that represents the space between these gaps. For example, the non-critical polygon 1026 in FIG. 10C now has 3 critical portions as shown in FIG. 12C, and these are combined with the critical-shapes. The darker shapes in FIG. 12C are on one split layer, and the lighter shapes are on a different split layer. The location of the splits have a width >MAX_CRIT_WIDTH, and are written with any suitable standard lithography tool. The edges where the darker and lighter colored shapes abut are separated, creating a gap between the shapes. This gap is referred to as the "split gap".

In a similar manner, gaps are created for the shapes 1001 and 1003 in FIGS. 11A and 11B, respectively. The darker colored shapes are on one split layer and the lighter colored shapes are placed on another split layer, with gaps created between the shapes as shown in FIGS. 12A and 12B.

Returning back to FIG. 8, polygons are created between critical shapes and between critical shapes and noncritical shapes (806). The polygons are created using a range of MIN_CRIT_SPACE to MAX_CRIT_SPACE. These polygons abut the edge of both shapes that are adjacent to each other, forming a polygon. These polygons are referred to herein as "Crit_Region", and are illustrated as the dotted portion of FIG. 13.

Mask assignments are performed for the shapes in the design (808). This action determines which mask each of the shapes should be placed. Any suitable EDA tool can be employed to perform this action, including for example, the Virtuoso Phase Designer (VPD) tool, available from Cadence Design Systems, Inc. of San Jose, Calif. The VPD command geomColor is employed to pass in the Critical shapes and the Crit_Region shapes, and return the shapes split into two different mask layers. One approach for implementing this action is to determine any Crit_Region shape that abuts two and only two Critical shapes, which represents the environment where the Critical shapes is to be interleaved to different layers. These shapes are marked with the relationship "interleave". A second VPD command getColor is used to output the interleaved shapes into two separate polygon layers for output. FIG. 14 illustrates example results of performing this operation on the shapes in FIG. 13.

Gaps are added back on the correct split layer with a user defined overlap (SPLIT_OVERLAP). FIG. 15 illustrates example results of performing this action on the shapes in FIG. 14.

Figure 16:
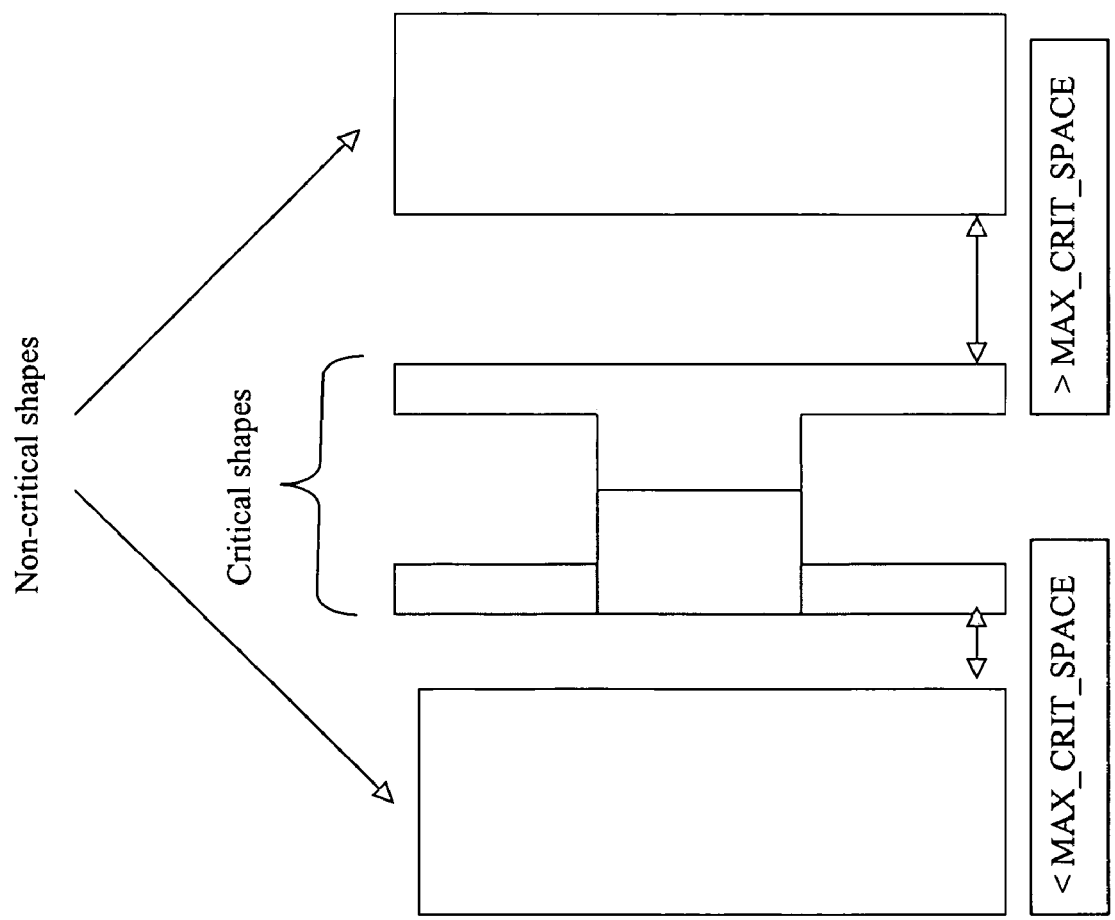
FIG. 16 shows circumstances involving non-critical shapes in the proximity of critical shapes.

A determination is made regarding the placement of non-critical shapes in the design. Normally, any non-critical width shape can be placed next to any other non-critical width shapes in the layout. In some cases, a non-critical shape should be located on a specific mask. For example, in some embodiments, non-critical width shapes should have an interleaved character relative to other shapes if they are within the Max_Crit_Space of a critical shape. This example is illustrated in FIG. 16.

Figure 17:
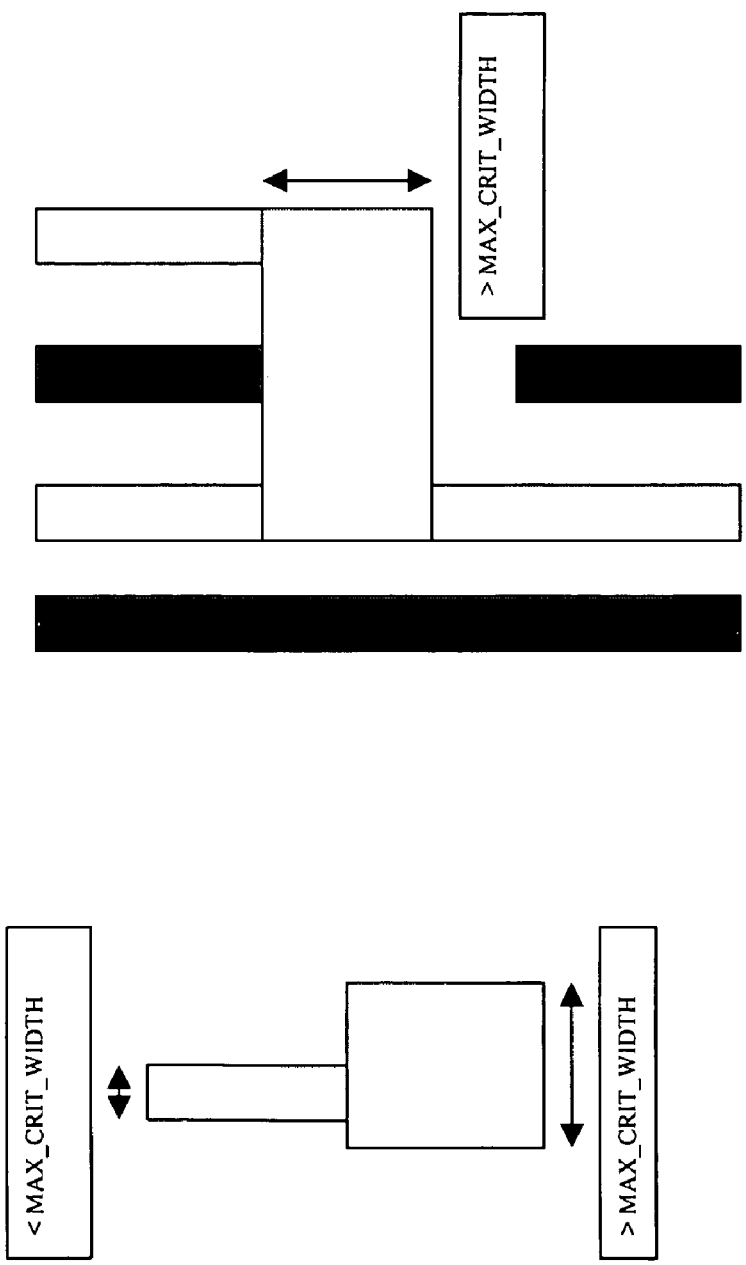
FIG. 17 illustrates configurations of non-critical shapes that either abut or do not abut critical shapes.

Non-Critical shapes that touch a critical shape can be placed on the split layer that matches the abutting critical shape. Any non-critical shapes that do not abut a critical shape can be placed on the first critical layer. These circumstances are illustrated in FIG. 17.

Layouts that are over-constrained can be modified by creating larger spaces between the non-critical shapes and critical shapes in order to allow more flexibility in the interleaving of shapes, as illustrated in FIG. 18.

Error checking can be performed on the results to verify success of the Mask assignment operation. The following are examples of error checking operations that can be performed:

Check for any shapes smaller than a threshold value.

Check for any split poly shapes that are closer than a threshold value and report these as errors.

Check for any critical poly shapes that are closer than a threshold value and make sure they are on different output layers.

If they are farther away, report these as "floating" critical shapes.

Add a check for locations where split layers touch. These are intentional split locations for the non-critical polygons, and should be reviewed for the lithographic quality of split.

Under certain circumstances, the photomasks for the different exposures are configured to cause overlaps between the different exposures. One example circumstance for which this occurs is to correct for optical effects of the lithographic process.

Figure 19A:
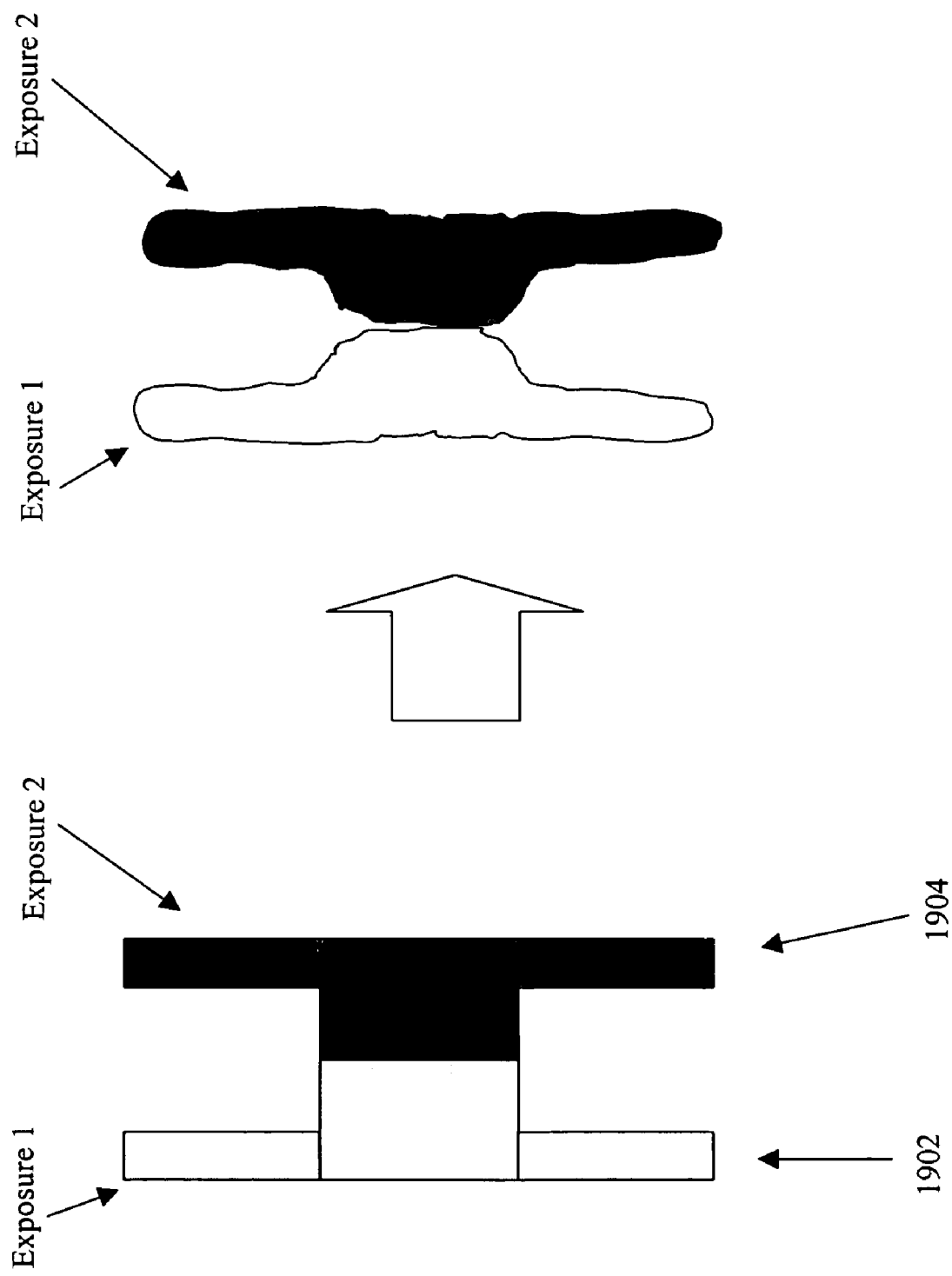
FIGS. 19A-B show overlapping regions between exposures.

To illustrate, consider the shapes 1902 and 1904 shown in FIG. 19A. Assume that shape 1902 is printed using a first exposure and that shape 1904 is printed using a second exposure. The optical effects of the lithographic process may cause the ends of the shapes to become rounded as shown on the right side of FIG. 19A. This could result in a printed set of shapes that do not correspond to the intended layout shapes. For example, the portion where shapes 1902 meet with shapes 1904 could be rounded enough to cause insufficient contact between the two sets of shapes, possibly causing a defect on the resulting IC.

Figure 19B:
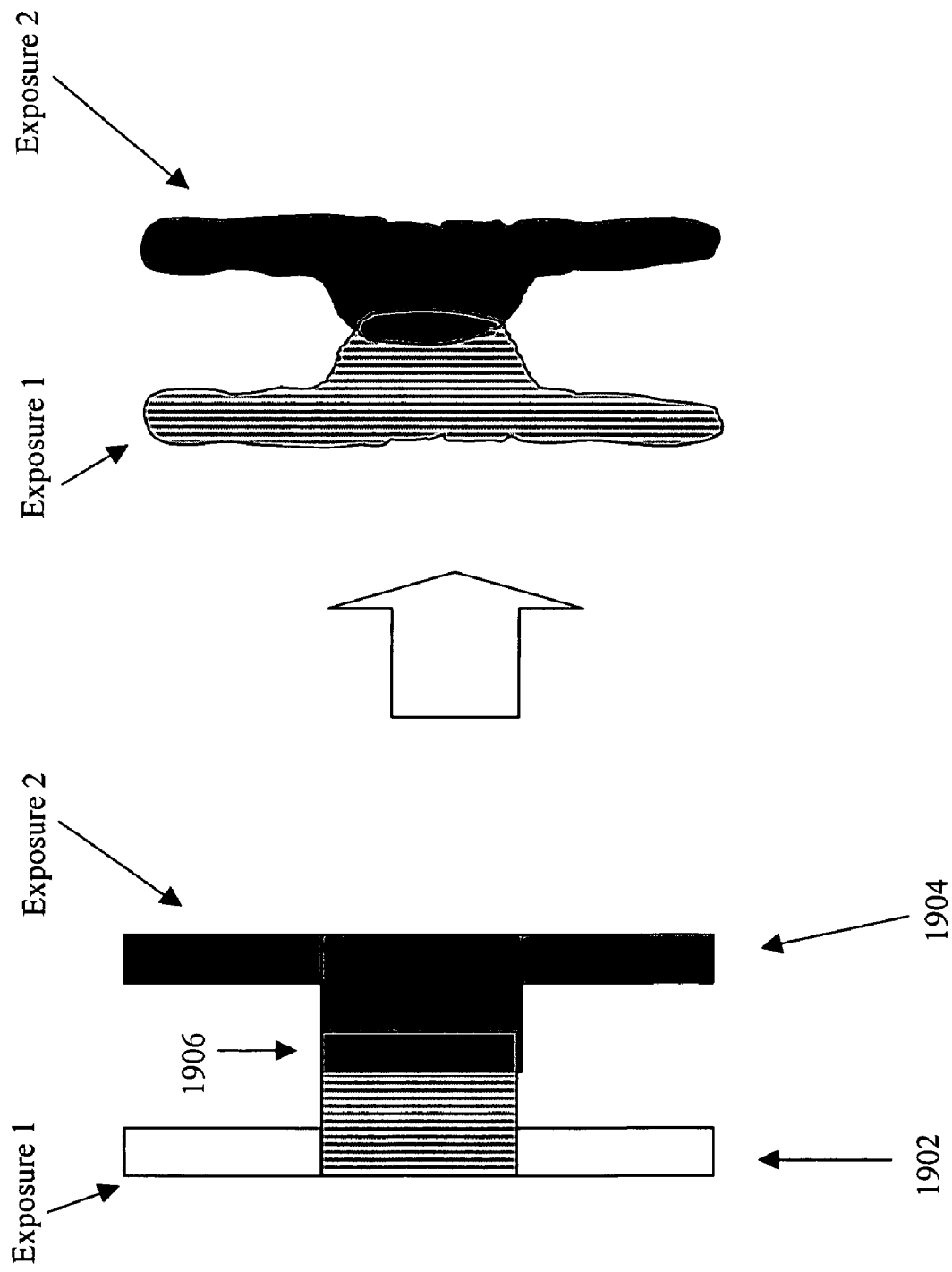

To correct this type of optical effect, the shapes 1902 and 1904 can be extended towards each other, causing an overlap 1906 over a portion of the layout that will be printed by the masks associated with each set of shapes 1902 and 1904 as shown in FIG. 19B. Both exposures will print in the overlap region. This results in the illustrated example results on the right-hand side of FIG. 19B in which the overlap between the printed shapes more closely match the intended shapes on the design layout.

System Architecture Overview

Figure 20:
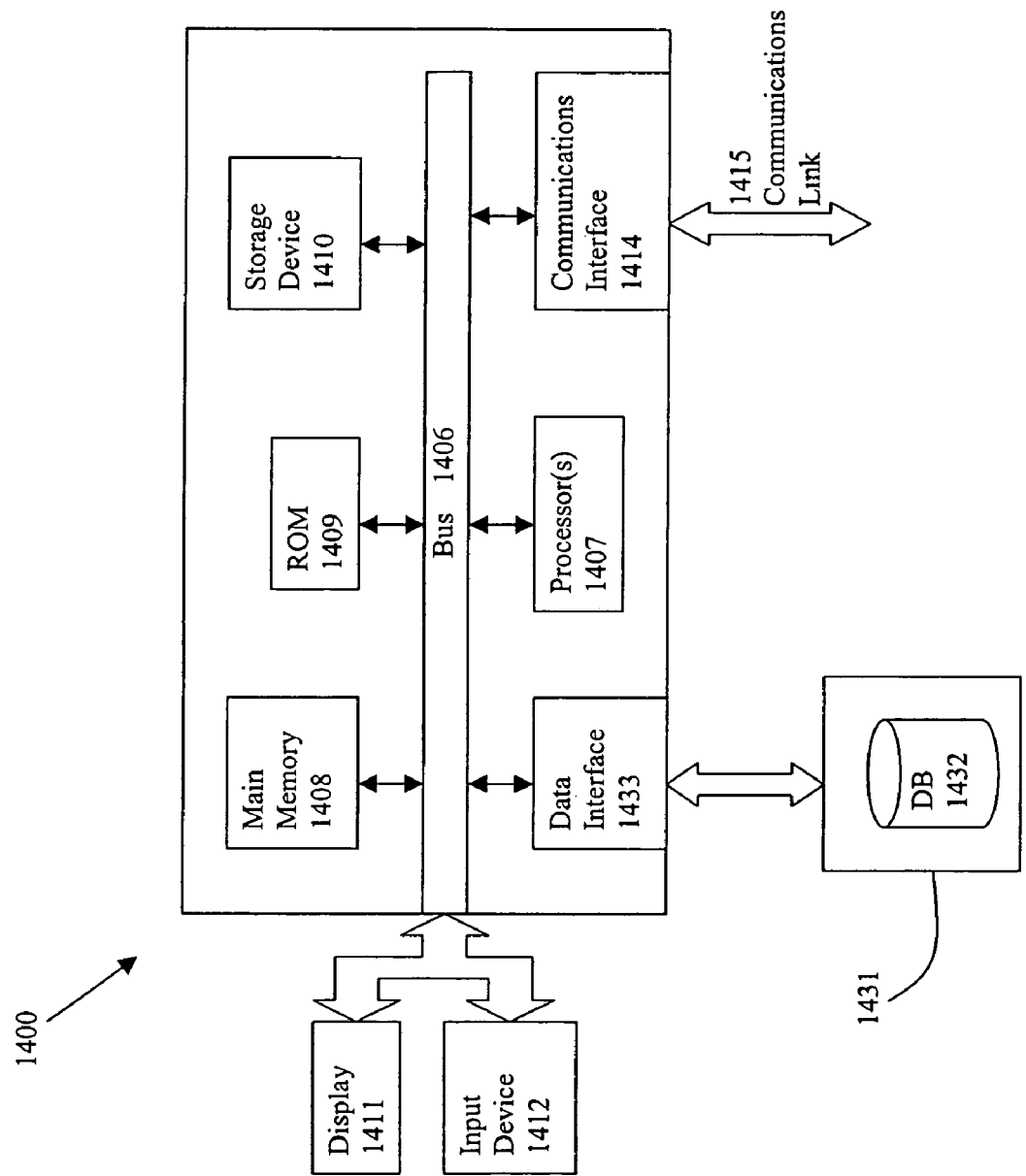
FIG. 20 illustrates an example computing architecture with which the invention may be implemented.

FIG. 20 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A method for printing images for an IC product using lithographic manufacturing equipment, the method comprising:
   identifying one or more critical features, the one or more critical features corresponding to one or more features on the IC product that cannot be printed in a single exposure of the lithographic manufacturing equipment;
   identifying one or more non-critical features, the one or more non-critical features being nearby at least one of the one or more critical features and corresponding to one or more features on the IC product that can be printed in a single exposure of the lithographic manufacturing equipment;
   splitting any of the one or more non-critical features; and
   generating data used to manufacture a first group of the one or more critical features using a first exposure and a second group of the one or more critical features using a second exposure.

2. The method of claim 1 in which the act of generating data comprises generation of mask assignment information, in which the first group corresponds to a first mask and the second group corresponds to a second mask.

3. The method of claim 1 in which the act of identifying one or more critical features comprises identification of a shape with a minimum width (MIN_CRIT_WIDTH) that is larger than or equal to a size that is printable and has a maximum width (MAX_CRIT_WIDTH) that is smaller than a size that is printable using a single exposure.

4. The method of claim 1 in which the act of splitting the one or more non-critical features identifies a non-critical features which abuts or is adjacent to a critical feature.

5. The method of claim 4 in which a logical cut-line is associated with the one or more non-critical features to be split based upon a number and configuration of a critical features abutting or adjacent to the one or more non-critical features.

6. The method of claim 1 further comprising:
   placing a gap between two shapes; and
   creating a polygon in the gap.

7. The method of claim 1 in which the one or more non-critical features are associated with either the first group or the second group.

8. The method of claim 7 in which a distance between a first non-critical feature and a second non-critical feature determines which group is associated with the first non-critical feature.

9. The method of claim 1 in which a larger space is generated between a non-critical feature and a critical feature to address an over-constrained layout.

10. The method of claim 1 further comprising error checking.

11. The method of claim 1 in which the one or more critical features or the one or more non-critical features are modified to address expected physical properties of lithographic effects of the lithographic manufacturing equipment.

12. The method of claim 11 in which a portion of an image of the first exposure overlaps a portion of an image of the second exposure.

13. The method of claim 1, in which some or all of the one or more critical features are identical.

14. The method of claim 1, in which all of the one or more critical features are distinct.

15. The method of claim 1, in which some or all of the one or more non-critical features are identical.

16. The method of claim 1, in which all of the one or more non-critical features are distinct.

17. The method of claim 1, in which the step of splitting any of the one or more non-critical features is based in part upon a determination of whether a first criterion is met.

18. The method of claim 17, in which the first criterion comprises determining whether all of the one or more critical features are printable.

19. The method of 17, in which the first criterion comprises:
   determining whether the one or more non-critical features are adjacent to the one or more critical features; and
   determining whether each of the first group and the second group of the one or more critical features are printable with a single exposure by the lithographic manufacturing equipment.

20. The method of 17, in which the first criterion comprises:
   determining whether the one or more non-critical features are within one or more threshold distances to the one or more critical features; and
   determining whether each of the first group and the second group of the one or more critical features are printable with a single exposure by the lithographic manufacturing equipment.

21. The method of 17, in which the first criterion comprises determining one or more locations to perform the splitting step to minimize a number of exposures to print all of the features of the IC product.

22. The method of claim 1, further comprising:
   splitting the one or more non-critical features based in part on a second criterion.

23. The method of claim 22, in which the second criterion comprises:
   identifying a spacing between two critical features; and
   determining whether the spacing is smaller than a threshold value.

24. The method of claim 1, in which the step of splitting any of the one or more non-critical features further comprises:
   placing a gap of a first width between the at least two sub-features; and
   creating a polygon in the gap of the first width.

25. The method of claim 24, in which the first width is smaller than a minimum width which is printable by the lithographic manufacturing equipment.

26. The method of claim 1, further comprising:
   splitting the one or more critical features based in part upon a result of the step of splitting any of the one or more non-critical features when a third criterion is met.

27. The method of claim 26, in which the third criterion comprises:
   minimizing a number of exposures to print both the one or more critical features and the one or more non-critical features.

28. A method for printing images for an IC product using lithographic manufacturing equipment, the method comprising:
   identifying one or more features, the one or more features corresponding to one or more geometries to be manufactured with multiple exposures of the lithographic manufacturing equipment;

identifying one or more non-critical features, the one or more non-critical features being nearby at least one of one or more critical features which correspond to the one or more features of the IC product that cannot be printed in a single exposure of the lithographic manufacturing equipment;

splitting any of the one or more non-critical features; and generating data used to manufacture the one or more features using the multiple exposures.

29. The method of claim 28 in which the act of generating data comprises generation of mask assignment information.

30. The method of claim 28 further comprising:

identifying one or more critical features, the one or more critical features corresponding to one or more features of the IC product that cannot be printed in a single exposure of the lithographic manufacturing equipment.

31. The method of claim 30 in which the act of identifying one or more critical features comprises identification of a shape with a minimum width (MIN_CRIT_WIDTH) that is larger than or equal to a size that is printable and has a maximum width (MAX_CRIT_WIDTH) that is smaller than a size that is printable using a single exposure.

32. The method of claim 30 in which the act of splitting the non-critical features identifies non-critical features which abut or are adjacent to a critical feature.

33. The method of claim 28 further comprising:

placing a gap between two shapes; and creating a polygon in the gap.

34. The method of claim 28 in which the one or more features are modified to address expected physical properties of lithographic effects of the lithographic manufacturing equipment.

35. The method of claim 34 in which a portion of a first image for a first exposure overlaps a portion of a second image for a second exposure.

36. The method of claim 28 further comprising breaking a layout into two or more exposures, each with arbitrarily thin lines but greater than a necessary pitch.

37. The method of claim 28 further comprising:

identifying one or more first features on the IC product that should be subject to a separate exposure from one or more second features;

printing the one or more first features using a first exposure; and printing the one or more second features using a second exposure.

38. The method of claim 37 in which first data for a first mask is generated corresponding to the one or more first features and second data is generated corresponding to the one or more second features.

39. The method of claim 37 in which a feature is split to place part of the feature on the first exposure and another part of the feature to the second exposure.

40. The method of claim 28 in which the method is performed automatically by an electronic design automation tool.

41. The method of claim 28 in which an IC product is manufactured based upon the method.

42. A system for printing images for an IC product using lithographic manufacturing equipment, the method comprising:

means for identifying one or more critical features, the one or more critical features corresponding to one or more features on the IC product that cannot be printed in a single exposure of the lithographic manufacturing equipment;

means for identifying one or more non-critical features, the one or more non-critical features being nearby at least one of the one or more critical features and corresponding to one or more features on the IC product that can be printed in a single exposure of the lithographic manufacturing equipment;

means for splitting any of the one or more non-critical features; and means for generating data used to manufacture a first group of the one or more critical features using a first exposure and a second group of the one or more critical features using a second exposure.

43. A computer program product comprising computer usable medium having executable code for executing a process for printing images for an IC product using lithographic manufacturing equipment, the process comprising:

identifying one or more critical features, the one or more critical features corresponding to one or more features on the IC product that cannot be printed in a single exposure of the lithographic manufacturing equipment;

identifying one or more non-critical features, the one or more non-critical features being nearby at least one of the one or more critical features and corresponding to one or more features on the IC product that can be printed in a single exposure of the lithographic manufacturing equipment;

splitting any of the one or more non-critical features; and generating data used to manufacture a first group of the one or more critical features using a first exposure and a second group of the one or more critical features using a second exposure.

44. A system for printing images for an IC product using lithographic manufacturing equipment, the method comprising:

means for identifying one or more features, the one or more features corresponding to one or more geometries to be manufactured with multiple exposures of the lithographic manufacturing equipment;

means for identifying one or more non-critical features, the one or more non-critical features being nearby at least one of one or more critical features which correspond to the one or more features of the IC product that cannot be printed in a single exposure of the lithographic manufacturing equipment;

means for splitting any of the one or more non-critical features; and means for generating data used to manufacture the one or more features using the multiple exposures.

45. A computer program product comprising computer usable medium having executable code for executing a process for printing images for an IC product using lithographic manufacturing equipment, the process comprising:

identifying one or more features, the one or more features corresponding to one or more geometries to be manufactured with multiple exposures of the lithographic manufacturing equipment;

identifying one or more non-critical features, the one or more non-critical features being nearby at least one of one or more critical features which correspond to the one or more features of the IC product that cannot be printed in a single exposure of the lithographic manufacturing equipment;

splitting any of the one or more non-critical features; and generating data used to manufacture the one or more features using the multiple exposures.

* * * * *